United States Patent
Hwang et al.

(10) Patent No.: US 6,569,982 B2
(45) Date of Patent: May 27, 2003

(54) CURABLE POLYPHENYLENE ETHER RESIN, COMPOSITION MADE THEREFROM, AND PROCESS FOR PREPARING THE RESIN

(75) Inventors: Gue-Wuu Hwang, Kaohsiung (TW); Chien-Ting Lin, Hsinchu (TW); Chingchen S. Chiu, Taoyuan Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 16 days.

(21) Appl. No.: 09/848,524

(22) Filed: May 3, 2001

(65) Prior Publication Data

US 2002/0077447 A1 Jun. 20, 2002

(30) Foreign Application Priority Data

Dec. 19, 2000 (TW) ........................................ 89127237 A

(51) Int. Cl.[7] .............................................. C08G 65/38
(52) U.S. Cl. ...................... 528/86; 528/489; 525/330.9; 525/332.5; 524/540; 428/422.8; 428/423.1; 428/426
(58) Field of Search ................ 528/489, 86; 525/330.9, 525/332.5; 524/540; 428/422.8, 423.1, 426

(56) References Cited

PUBLICATIONS

Ishii et al, Syntheses and properties of allylated poy(2, 6–dimethyl–1,4–phenylene ether, Journal, 1995, Chem Abstract 124: 57507.*

* cited by examiner

Primary Examiner—Duc Truong
(74) Attorney, Agent, or Firm—Darby & Darby

(57) ABSTRACT

The present invention provides a curable polyphenylene ether (PPE) resin, a composition made therefrom, and a process for preparing the resin. The process involves introducing a vinyl group-containing functional group to the terminal end of PPE by modifying the hydroxy and ester groups on the terminal end. Thus, a curable thermosetting PPE resin including a vinyl group on the terminal end can be obtained. Since the dehydrogenation of side chain methyl using n-BuLi is not conducted in the process of the present invention, the process is much easier, and the cost can be decreased.

8 Claims, 2 Drawing Sheets

CURABLE POLYPHENYLENE ETHER RESIN, COMPOSITION MADE THEREFROM, AND PROCESS FOR PREPARING THE RESIN

BACKGROUND OF THE INVENTION

1. Field of the Invention

The present invention relates to a curable polyphenylene ether (PPE) resin, a composition made therefrom, and a process for preparing the resin. More particularly, the present invention relates to a process for preparing a curable polyphenylene ether resin, which involves introducing a vinyl group-containing functional group to the terminal end of PPE.

2. Description of the Prior Art

Communication devices tend to function at higher speeds and frequencies. The substrate material for such devices, such as wireless communication networks, satellite communication equipment, high performance and broadband devices, high speed computers and computer work stations, demands a high glass transition temperature (Tg), low dielectric constant (Dk), and low loss factor (Df). Presently, the copper-clad laminate used for printed circuit boards (PCB) is mainly FR-4, and the substrate of which is made of epoxy resin. However, electrical properties (such as Dk and Df) of FR-4 can no longer meet the increasing needs of high frequency.

Polyphenylene ether (PPE), having high Tg and superior electrical properties, is a potential material for high frequency substrates. However, PPE is a thermoplastic resin and is poor in solvent resistance. Therefore, there is a need to modify PPE into a thermosetting resin so as to increase the solvent resistance and heat resistance properties.

In order to improve the solvent resistance and heat resistance of PPE, Asahi Company in EP 382,312 uses a composition including allylated PPE (APPE), triallyl isocyanurate (TAIC), and PH25B (an initiator) to fabricate a substrate. First, PPE is subjected to dehydrogenation of side chain methyl (—CH$_3$) by using n-butyl lithium (n-BuLi), which is then reacted with CH$_2$=CHCH$_2$X (wherein X=Cl, Br, or I) so as to modify the side chain into —CH$_2$CH$_2$CH=CH$_2$. Thus, a curable PPE resin is obtained. Since the process involves using n-BuLi to conduct dehydrogenation of —CH$_3$, the preparation is not easy and the cost is high.

SUMMARY OF THE INVENTION

An object of the present invention is to solve the above-mentioned problems and to provide an easy and inexpensive process for preparing a curable polyphenylene ether resin.

Another object of the present invention is to provide a novel curable polyphenylene ether resin.

A further object of the present invention is to provide a novel polyphenylene ether resin composition, which can be used in preparing pre-pregs and copper-clad laminates for printed circuit boards.

To achieve the above objects, the process for preparing a curable polyphenylene ether resin of the present invention includes:

reacting a polyphenylene ether resin respresented by formula (I), a strong base, and a compound containing a leaving group and vinyl group to obtain a curable polyphenylene ether resin represented by formula (II), wherein formula (I) is:

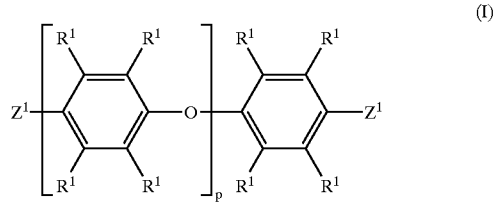

wherein

R$^1$ can be the same or different and is selected from the group consisting of H, alkyl having from 1 to 3 carbon atoms, and

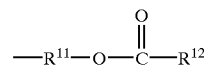

wherein

R$^{11}$ is alkylene having from 1 to 3 carbon atoms, and R$^{12}$ is aryl;

Z$^1$ can be the same or different and is selected from the group consisting of H, OH, and

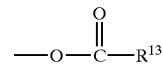

and at least one Z$^1$ is OH or

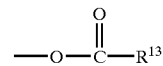

wherein

R$^{13}$ is aryl;

p is from 2 to 165, wherein the compound containing leaving group and vinyl group has the formula (A) or (B):

wherein

X is a leaving group selected from the group consisting of halogen and sulfonate;

A is selected from the group consisting of C$_{1-8}$ ethers, C$_{1-8}$ amines, C$_{1-8}$ amides, and C$_{1-8}$ esters;

n is 1 or 2; and m is 0 or an integer of from 1 to 6, wherein formula (II) is

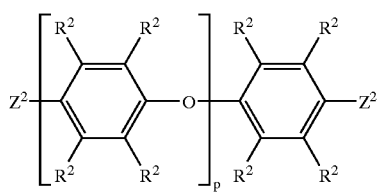
(II)

wherein
R$^2$ can be the same or different and is selected from the group consisting of H, alkyl having from 1 to 3 carbon atoms,

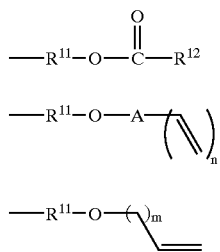

wherein
R$^{11}$ is alkylene having from 1 to 3 carbon atoms;
R$^{12}$ is aryl;
A is selected from the group consisting of C$_{1-8}$ ethers, C$_{1-8}$ amines, C$_{1-8}$ amides, and C$_{1-8}$ esters;
n is 1 or 2; and
m is 0 or an integer of from 1 to 6;
Z$^2$ can be the same or different and is selected from the group consisting of H, OH,

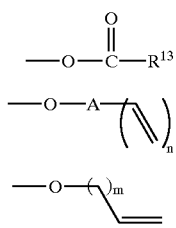
(i)

(ii)

and at least one Z$^2$ is the group represented by formula (i) or (ii), wherein R$^{13}$ is aryl, and A, n, m are defined as above;
p is from 2 to 165.

BRIEF DESCRIPTION OF THE DRAWINGS

The present invention will become more fully understood from the detailed description given herein and the accompanying drawings, given by way of illustration only and thus not intended to be limitative of the present invention.

DETAILED DESCRIPTION OF THE INVENTION

Figure 1:
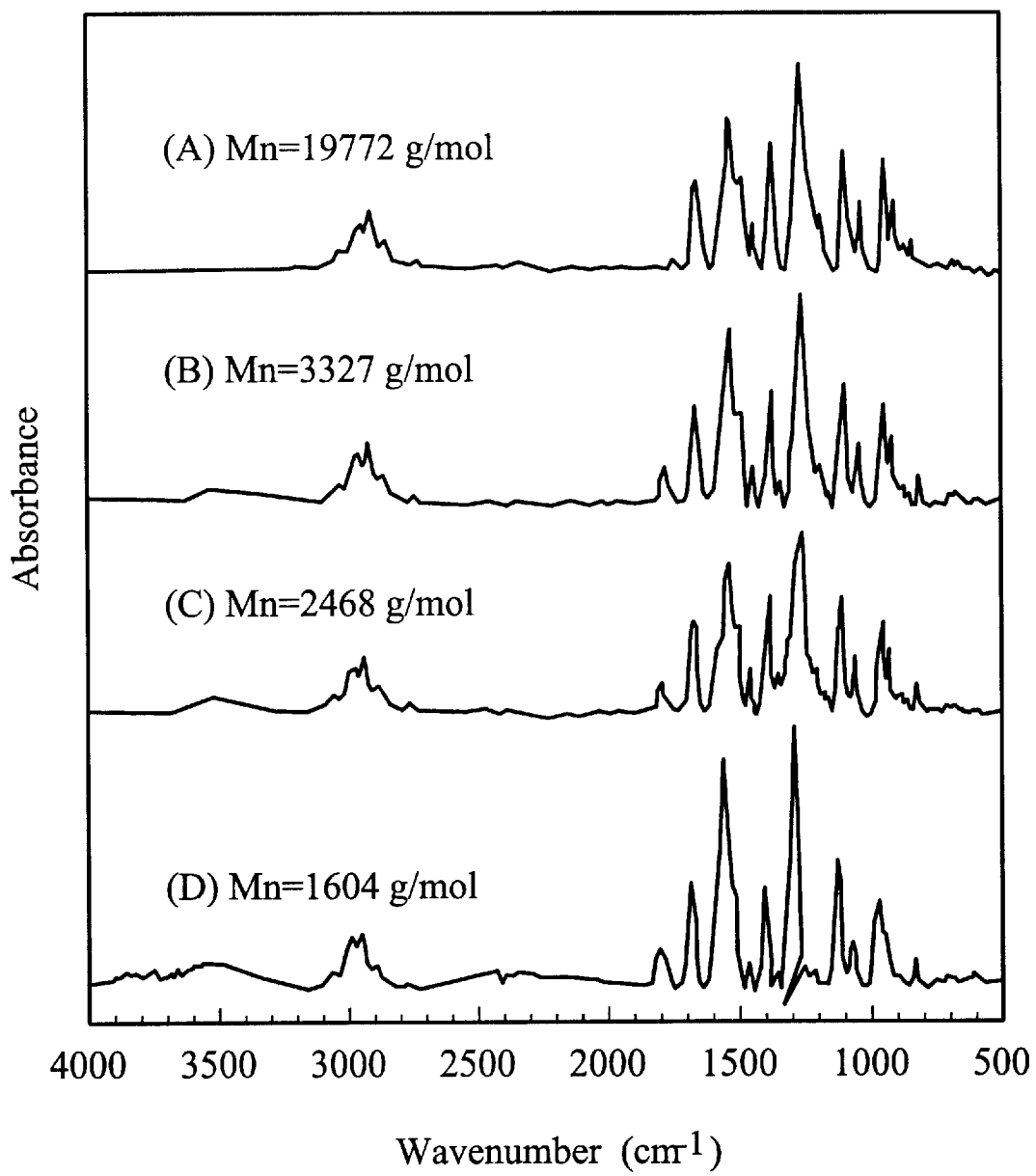
FIG. 1 shows the IR spectra of unredistributed PPE (A), and redistributed PPE (rPPE) (B) to (D) having different molecular weights (Mn) according to Example 1 of the present invention.

The present invention mainly provides a process for preparing a curable polyphenylene ether (PPE) resin. The hydroxy (—OH) and ester [—O—(C=O)—R$^{13}$, R$^{13}$ is aryl] groups on the terminal end of PPE is modified by introducing a vinyl group-containing functional group. Thus, a curable thermosetting PPE resin having a vinyl group on the terminal end can be obtained. In the present invention, since the dehydrogenation of methyl using n-BuLi as in the Asahi patent is not conducted, the process is much easier, and the cost can be decreased.

According to the present invention, the process for preparing a curable polyphenylene ether is described as follows. A polyphenylene ether resin represented by formula (I) is reacted with a strong base and a compound containing a leaving group and vinyl group. Thus, a curable polyphenylene ether resin represented by formula (II) is obtained.

Formula (I) is:

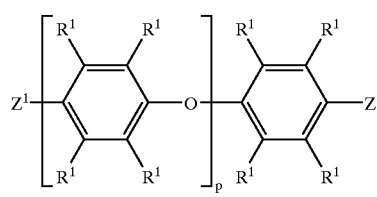
(I)

wherein
R$^1$ can be the same or different and is selected from the group consisting of H, alkyl having from 1 to 3 carbon atoms, and

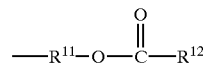

wherein
R$^{11}$ is alkylene having from 1 to 3 carbon atoms, and R$^{12}$ is aryl;
Z$^1$ can be the same or different and is selected from the group consisting of H, OH, and

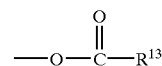

and at least one Z$^1$ is OH or

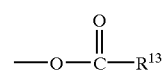

wherein
R$^{13}$ is aryl;
p is from 2 to 165.
The compound containing leaving group and vinyl group has the formula (A) or (B):

(A)

-continued

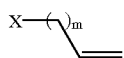
(B)

wherein
  X is a leaving group selected from the group consisting of halogen and sulfonate;
  A is selected from the group consisting of $C_{1-8}$ ethers, $C_{1-8}$ amines, $C_{1-8}$ amides, and $C_{1-8}$ esters;
  n is 1 or 2; and
  m is 0 or an integer of from 1 to 6.

Formula (II) is

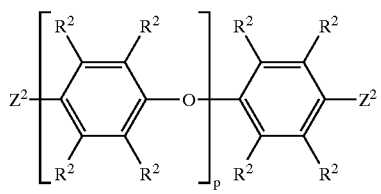
(II)

wherein
  $R^2$ can be the same or different and is selected from the group consisting of H, alkyl having from 1 to 3 carbon atoms,

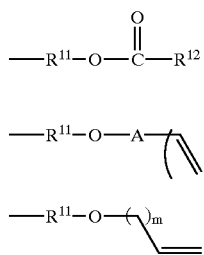

wherein
  $R^{11}$ is alkylene having from 1 to 3 carbon atoms;
  $R^{12}$ is aryl;
  A is selected from the group consisting of $C_{1-8}$ ethers, $C_{1-8}$ amines, $C_{1-8}$ amides, and $C_{1-8}$ esters;
  n is 1 or 2; and
  m is 0 or an integer of from 1 to 6;
  $Z^2$ can be the same or different and is selected from the group consisting of H, OH,

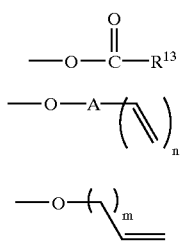
(i)

(ii)

and at least one $Z^2$ is the group represented by formula (i) or (ii), wherein $R^{13}$ is aryl, and A, n, m are defined as above;
  p is from 2 to 165.

In the PPE represented by formula (I), at least one end group $Z^1$ is hydroxy (—OH) or ester [—O—(C=O)—$R^{13}$, $R^{13}$ is aryl]. After the PPE is reacted with the strong base and the compound containing a leaving group and vinyl group, the end group $Z^1$ is modified into $Z^2$. At least one $Z^2$ is the group represented by formula (i) or (ii):

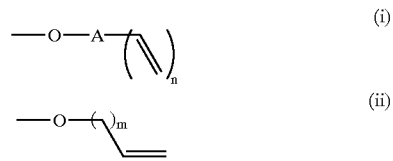
(i)

(ii)

In other words, by means of introducing a vinyl group-containing functional group, the present invention provides a method to modify the thermoplastic PPE resin containing no vinyl group on the end into a curable thermosetting PPE resin containing a vinyl group on the end.

In the modification reaction, the most important step is that a vinyl group-containing functional group is introduced onto the terminal end. In addition, the vinyl group-containing functional group can also be introduced onto the side chain of PPE. For example, when at least one side chain $R^1$ of PPE of formula (I) is —$R^{11}$—O—(C=O)—$R^{12}$ ($R^{11}$ is alkylene having from 1 to 3 carbon atoms, $R^{12}$ is aryl) (that means, the side chain contains an ester group), after the modification reaction of PPE with the strong base and the compound containing a leaving group and vinyl group, the vinyl group can also be introduced onto the side chain. Thus, $R^2$ group becomes

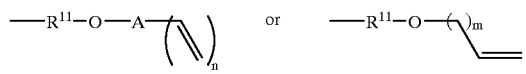

wherein
  $R^{11}$ is defined as above;
  A is selected from the group consisting of $C_{1-8}$ ethers, $C_{1-8}$ amines, $C_{1-8}$ amides, and $C_{1-8}$ esters;
  n is 1 or 2; and m is 0 or an integer of from 1 to 6.

The strong base suitable for use in the present invention can be hydroxides of alkali metal, hydrides of alkali metal, or hydrides of alkaline earth metal. Representative examples include lithium hydroxide, sodium hydroxide, potassium hydroxide, sodium hydride, and calcium hydride.

In the compound containing leaving group and vinyl group used in the present invention, the leaving group can be a halogen leaving group or sulfonate leaving group. The halogen can be chlorine, bromine, or iodine. The sulfonate can be tosylate or mesylate. Such a compound containing leaving group and vinyl group can be allyl-halo-acyl-amides, allyl-halo-amines, allyl-halo-acyl-esters, allyl halides, or pentene sulfonic esters. Representative examples include 3-bromo-1-propene, N,N-diallyl-2-chloroacetamide, 2-chloroacetic acid allyl ester, and 5-(toluene-4-sulfonyloxy)-pent-1-ene.

The process for preparing the curable polyphenylene ether resin of the present invention is preferably conducted in the presence of a phase transfer catalyst. Suitable phase transfer catalyst can be $NR^3_4{}^+Y^-$, wherein $R^3$ is alkyl having from 1 to 6 carbon atoms, and $Y^-$ is $Br^{31}$, $I^-$, $OH^-$ or $HSO_4^-$ (hydrogensulfate). Representative examples include n-$Bu)_4$ $NHSO_4$, (n-Bu)$_4$NOH, (n-Bu)$_4$NBr, (n-Bu)$_4$NI, tetra-n-propylammonium hydrogensulfate, and tetra-n-propylammonium iodide.

The present invention also provides a curable polyphenylene ether resin that is represented by the formula (II)

$$\left[ \begin{array}{c} R^2 \quad R^2 \\ Z^2 \begin{array}{c} R^2 \\ R^2 \end{array} \begin{array}{c} R^2 \\ R^2 \end{array} O \end{array} \right]_p \begin{array}{c} R^2 \quad R^2 \\ R^2 \quad R^2 \end{array} Z^2 \tag{II}$$

wherein $R^2$ can be the same or different and is selected from the group consisting of H, alkyl having from 1 to 3 carbon atoms, $$-R^{11}-O-\overset{O}{\underset{\|}{C}}-R^{12}$$

$$-R^{11}-O-A\!\!-\!\!\left(\!\!\diagup\!\!\!\diagdown\!\!\right)_{\!\!n}$$

$$-R^{11}-O-(\quad)_m\diagdown\!\!\!=$$

wherein $R^{11}$ is alkylene having from 1 to 3 carbon atoms;

$R^{12}$ is aryl;

A is selected from the group consisting of $C_{1-8}$ ethers, $C_{1-8}$ amines, $C_{1-8}$ amides, and $C_{1-8}$ esters;

n is 1 or 2; and m is 0 or an integer of from 1 to 6;

$Z^2$ can be the same or different and is selected from the group consisting of H, OH, $$-O-\overset{O}{\underset{\|}{C}}-R^{13}$$

$$-O-A\!\!-\!\!\left(\!\!\diagup\!\!\!\diagdown\!\!\right)_{\!\!n} \tag{i}$$

$$-O-(\quad)_m\diagdown\!\!\!= \tag{ii}$$

and at least one $Z^2$ is the group represented by formula (i) or (ii), wherein $R^{13}$ is aryl, and A, n, m are defined as above;

p is from 2 to 165.

In the curable polyphenylene ether resin of formula (II), when $Z^2$ is $$-O-A\!\!-\!\!\left(\!\!\diagup\!\!\!\diagdown\!\!\right)_{\!\!n} \tag{i}$$

and A is a $C_{1-8}$ amide, a representative example of $Z^2$ is $-O-CH_2(C=O)-N-(CH_2CH=CH_2)_2$. When $Z^2$ is the group of formula (i), and A is a $C_{1-8}$ ester, a representative example of $Z^2$ is $-O-CH_2(C=O)-O-CH_2-CH=CH_2$.

When $Z^2$ is $$-O-(\quad)_m\diagdown\!\!\!= \tag{ii}$$

a representative example of $Z^2$ is $-O-CH_2-CH=CH_2$.

The present invention also provides a polyphenylene ether resin composition, comprising:

(a) a curable polyphenylene ether resin which is represented by the formula (II); and (b) 0.5 wt % to 10 wt % of a free radical initiator, based on the total weight of the composition.

The free radical initiators suitable for use in the present invention include 2,5-dimethyl-2,5-di-tert-butylperoxy-hexane (DHBP), di-tert-butylperoxide (DTBP), di-cumylperoxide (DCP), benzoylperoxide (BPO), 1,3-di(2-tert-butylperoxy isopropyl)benzene (DIPP), and 2,5-dimethyl-2,5-di-tert-butylperoxy-hexyne (DYBP).

The polyphenylene ether resin composition of the present invention can further include 0.1 wt % to 95 wt % of a curing agent, based on the total weight of the composition. Representative examples of the curing agents include triallyl isocyanurate (TAIC) and triallyl cyanurate (TAC).

The polyphenylene ether resin composition of the present invention can also include 0.1 wt % to 50 wt % of a flame retardant, based on the total weight of the composition. The flame retardant can be phosphorus-containing flame retardants, chlorine-containing flame retardants, bromine-containing flame retardants, nitrogen-containing flame retardants, oxides of antimony, aluminum hydroxide, magnesium hydroxide, or mixtures thereof. A representative example of the bromine-containing flame retardant is N1,N1-diallyl-2-[2,6-dibromo-4-(2-{3,5-dibromo-4-[(diallylcarbamoyl)methoxy]phenyl}-1,1-dimethylethyl) phenoxy]acetamide.

According to the present invention, the above components of the resin composition are dissolved in a solvent and mixed thoroughly to form a varnish. Then, a reinforcing material, such as paper or glass cloth, is impregnated in the varnish. After drying, a pre-preg is thus formed.

The above pre-preg is bonded to a copper foil by compression molding to form a copper-clad laminate. Such a copper-clad laminate has superior electrical properties and can meet the requirements for high speed and high frequency communication devices. Thus, it is suitable for use in fabricating printed circuit boards.

The following examples are intended to illustrate the process and the advantages of the present invention more fully without limiting its scope, since numerous modifications and variations will be apparent to those skilled in the art.

EXAMPLE 1

Redistribution of PPE 360 g of poly(2,6-dimethyl-1,4-phenylene ether) (a PPE having a number average molecular weight of 19772 g/mole, labelled as (A)) was dissolved in 360 g of toluene at 100° C. After complete dissolution, 54 g of bisphenol A (BPA) was added and 72 g of benzoylperoxide (BPO, 75% in water) was added dropwise. The reaction was conducted for 2 hours at 100° C. The mixture was allowed to cool to room temperature and 800 ml of methanol was added for precipitation. Then, the precipitated solid was washed with methanol at least two times. The product obtained was dried to give a redistributed PPE (rPPE) (B) (360 g). The product has a number average molecular weight of 3327 g/mole determined by using gel permeation chromatography (GPC).

The above mentioned procedures were repeated with the BPA and BPO amounts changed. Redistributed PPE (rPPE) (C) and (D) having different molecular weights were obtained.

FIG. 1 shows the IR spectra of unredistributed PPE (A), and redistributed PPE (rPPE) (B) to (D). It can be seen that the intensities of the peaks of 3500 cm$^{-1}$ (—OH stretching of Ar—OH), 1726 cm$^{-1}$ (C=O stretching of —O—CO—Ar), 1260 cm$^{-1}$ (C—O stretching of —O—CO—Ar), and 710 cm$^{-1}$ (Ar—H bending of 1-substituted benzoate) increase with the decrease of the molecular weight of rPPE. This indicates that in the structure of rPPE, the numbers of —OH and —O—CO—Ar groups increase with the decrease of the molecular weight.

EXAMPLE 2

Modification of the Terminal End of rPPE 50 g of rPPE (B) was dissolved in 500 ml of dichloromethane (CH$_2$Cl$_2$), and 10 g of 50 wt % NaOH aqueous solution was added. After 10 minutes of stirring at room temperature, 4.99 g of tetra-n-butylammonium hydrogensulfate (TBAHS) was added. After 10 minutes of stirring, 32.45 g of N,N-diallyl-2-chloroacetamide was added. After 13 hours of stirring at room temperature, 50 ml of deionized water was added. After 30 minutes of stirring, the water layer was removed, and saturated brine solution and deionized water were used to wash the organic layer respectively. The organic layer was then concentrated to an amount of 100 ml, which was then added dropwise into 500 ml of methanol to precipitate the product. The product was washed with methanol at least two times and dried to give an end-modified rPPE (ANCO-rPPE) (F) (about 50 g).

Peaks of δ5.2 ppm and δ5.8 ppm can be seen from the $^1$H-NMR spectrum. This indicates that there are double bonds in the ANCO-rPPE (F) structure. In addition, it can be calculated from the intensity ratio of δ5.2 ppm and δ6.47 ppm (Ar—H) that the double bond content (allyl group content) is about 19 mol %.

The above mentioned procedures were repeated, with rPPE (C) used for the reaction, and the NaOH and TBAHS amounts changed. Thus, ANCO-rPPE (G) and (H) with different double bond contents were obtained.

Figure 2:
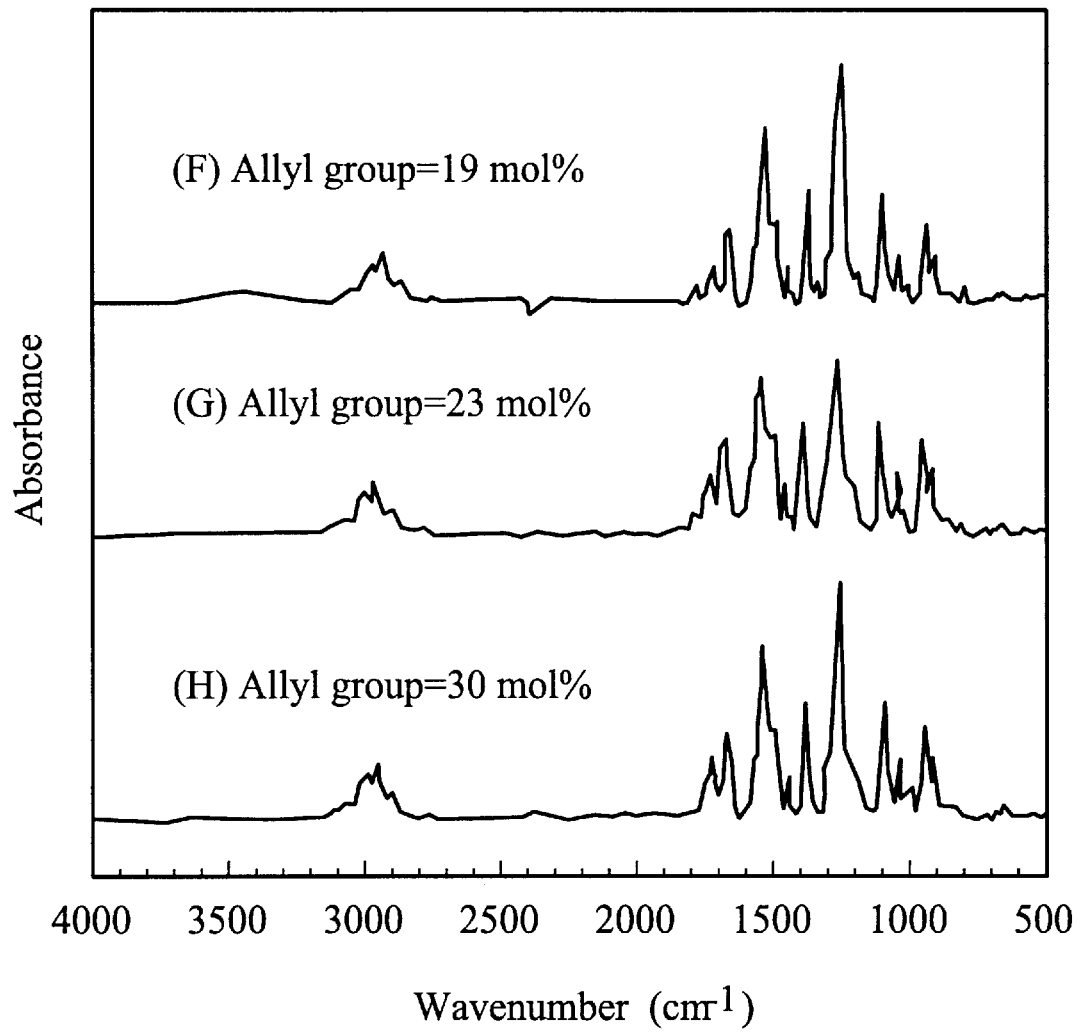
FIG. 2 shows the IR spectra of the end-modified rPPE (ANCO-rPPE) (F), (G), and (H) having different double bond contents according to Example 2 of the present invention.

FIG. 2 shows the IR spectra of ANCO-rPPE (F), (G), and (H). It can be seen that the peaks of 3500 cm$^{-1}$ (—OH stretching of Ar—OH), 1726 cm$^{-1}$ (C=O stretching of —O—CO—Ar), 1260 cm$^{-1}$ (C—O stretching of —O—CO—Ar), and 710 cm$^{-1}$ (Ar—H bending of 1-substituted benzoate) disappear gradually with the increase of the double bond content. In addition, new peak of 1658 cm$^{-1}$ (C=O stretching of —CO—N(CH$_2$—CH=CH$_2$)$_2$) has an increasing intensity with the increase of the double bond content. The above results show that in the structure of ANCO-rPPE product, —OH and —O—CO—Ar functional groups in the rPPE product can be modified to —O—CH$_2$—CO—N(CH$_2$—CH=CH$_2$)$_2$ functional group.

EXAMPLE 3

Curable PPE Resin Composition 7 g of ANCO-rPPE (F) and 0.21 g of DHBP (a free radical initiator) were dissolved in 20 ml of toluene and mixed thoroughly to form a varnish. The varnish was dried to remove toluene and then subjected to press molding under a pressure of 5 kg/cm$^2$ at 200° C. for 1 hour. The obtained resin sheet had good appearance and was not soluble in toluene or dichloromethane. The resin sheet was evaluated for dielectric properties and glass transition temperature by using a dielectric analyzer (HP 4291B) and a thermal mechanical analyzer (TMA). The results were: Dk=2.65, Df=0.004, and Tg=181° C.

EXAMPLE 4

Curable PPE Resin Composition (Containing a Curing Agent)

6 g of ANCO-rPPE (F), 0.21 g of DHBP (a free radical initiator), and 0.9 of TAIC (a curing agent) were dissolved in 19 ml of toluene and mixed thoroughly to form a varnish. The varnish was dried to remove toluene and then subjected to press molding under a pressure of 5 kg/cm$^2$ at 200° C. for 1 hour. The obtained resin sheet had good appearance and was not soluble in toluene or dichloromethane. The resin sheet was evaluated for dielectric properties and glass transition temperature by using a dielectric analyzer (HP 4291B) and a thermal mechanical analyzer (TMA). The results were: Dk=2.70, Df=0.004, and Tg=189° C.

EXAMPLE 5

Pre-Preg and Copper-Clad Laminate for Printed Circuit Board 22 g of ANCO-rPPE (F), 0.825 g of DHBP, and 5.5 g of TAIC were dissolved in 25 g of toluene and mixed thoroughly to form a varnish. Glass cloth was impregnated in the varnish and then removed to dry at 120° C. for 5 minutes. A pre-preg with good appearance was obtained. Twelve sheets of the pre-pregs were piled up and two copper foils were placed on and under the piled pre-pregs separately. The fourteen-layer structure was then subjected to press molding under a pressure of 5 kg/cm$^2$ at 200° C. for 1 hour. The copper-clad laminate obtained had good appearance and was not soluble in toluene or dichloromethane.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A curable polyphenylene ether resin which is represented by the formula (II)

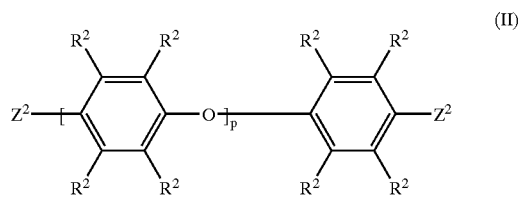

(II)

wherein

R$^2$ can be the same or different and is selected from the group consisting of H, alkyl having from 1 to 3 carbon atoms,

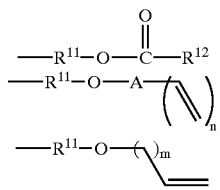

wherein

R$^{11}$ is alkylene having from 1 to 3 carbon atoms;

R$^{12}$ is aryl;

A is selected from the group consisting of C$_{1-8}$ ethers, C$_{1-8}$ amines, C$_{1-8}$ amides, and C$_{1-8}$ esters;

n is 1 or 2; and m is 0 or an integer of from 1 to 6;

Z$^2$ can be the same or different and is selected from the group consisting of H, OH,

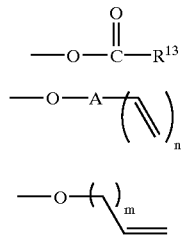

(i)

(ii)

and at least one Z$^2$ is the group represented by formula (i) or (ii), wherein R$^{13}$ is aryl, and A, n, m are defined as above;

p is from 2 to 165.

2. The curable polyphenylene ether resin as claimed in claim 1, wherein Z$^2$ is

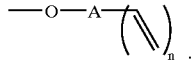

3. The curable polyphenylene ether resin as claimed in claim 2, wherein A is a C$_{1-8}$ amide.

4. The curable polyphenylene ether resin as claimed in claim 3, wherein Z$^2$ is —O—CH$_2$(C=O)—N—(CH$_2$CH=CH$_2$)$_2$.

5. The curable polyphenylene ether resin as claimed in claim 2, wherein A is a C$_{1-8}$ ester.

6. The curable polyphenylene ether resin as claimed in claim 5, wherein Z$^2$ is —O—CH$_2$(C=O)—O—CH$_2$—CH=CH$_2$.

7. The curable polyphenylene ether resin as claimed in claim 1, wherein Z$^2$ is

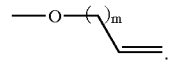

8. The curable polyphenylene ether resin as claimed in claim 7, wherein Z$^2$ is —O—CH$_2$—CH=CH$_2$.

* * * * *